(12) United States Patent  
Cheon

(10) Patent No.: US 9,303,842 B2  
(45) Date of Patent: Apr. 5, 2016

(54) DISPLAY APPARATUS

(71) Applicant: Kyu Hyeong Cheon, Yongin (KR)

(72) Inventor: Kyu Hyeong Cheon, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 208 days.

(21) Appl. No.: 13/729,868

(22) Filed: Dec. 28, 2012

(65) Prior Publication Data

US 2013/0201575 A1     Aug. 8, 2013

(30) Foreign Application Priority Data

Feb. 8, 2012   (KR) .................. 10-2012-0012924

(51) Int. Cl.
| | |
|---|---|
| G03F 5/00 | (2006.01) |
| G01D 11/28 | (2006.01) |
| F21V 7/04 | (2006.01) |
| F21V 11/00 | (2015.01) |
| H01L 51/50 | (2006.01) |
| H01L 33/08 | (2010.01) |
| H01L 51/52 | (2006.01) |

(52) U.S. Cl.
CPC ............... *F21V 11/00* (2013.01); *H01L 33/08* (2013.01); *H01L 51/50* (2013.01); *H01L 51/524* (2013.01); *H01L 51/5237* (2013.01); *H01L 51/5281* (2013.01)

(58) Field of Classification Search
CPC ....................................................... G03F 1/144
USPC ................................. 359/893; 362/23.19, 611
See application file for complete search history.

(56) References Cited

U.S. PATENT DOCUMENTS

| | | | |
|---|---|---|---|
| 2006/0139952 A1* | 6/2006 | Inoue et al. | 362/613 |
| 2010/0182265 A1 | 7/2010 | Kim et al. | |
| 2010/0259828 A1* | 10/2010 | Byeon et al. | 359/609 |
| 2011/0007398 A1* | 1/2011 | Lim et al. | 359/614 |
| 2011/0143815 A1 | 6/2011 | Inami | |

FOREIGN PATENT DOCUMENTS

| | | |
|---|---|---|
| KR | 10-2003-0045892 A | 6/2003 |
| KR | 10-2010-0082451 A | 7/2010 |
| KR | 10-2011-0066891 A | 6/2011 |

* cited by examiner

*Primary Examiner* — Jade R Chwasz  
(74) *Attorney, Agent, or Firm* — Lee & Morse, P.C.

(57) ABSTRACT

A display apparatus includes a display panel that displays an image, a window member, and an adhesive layer. The window member includes a base film that has a light transmission area that exposes the image of the display panel, the light transmission area is surrounded by a blocking area, a blocking pattern on the blocking area, and a dam pattern on the blocking pattern. The adhesive layer is between the display panel and the window member.

20 Claims, 9 Drawing Sheets

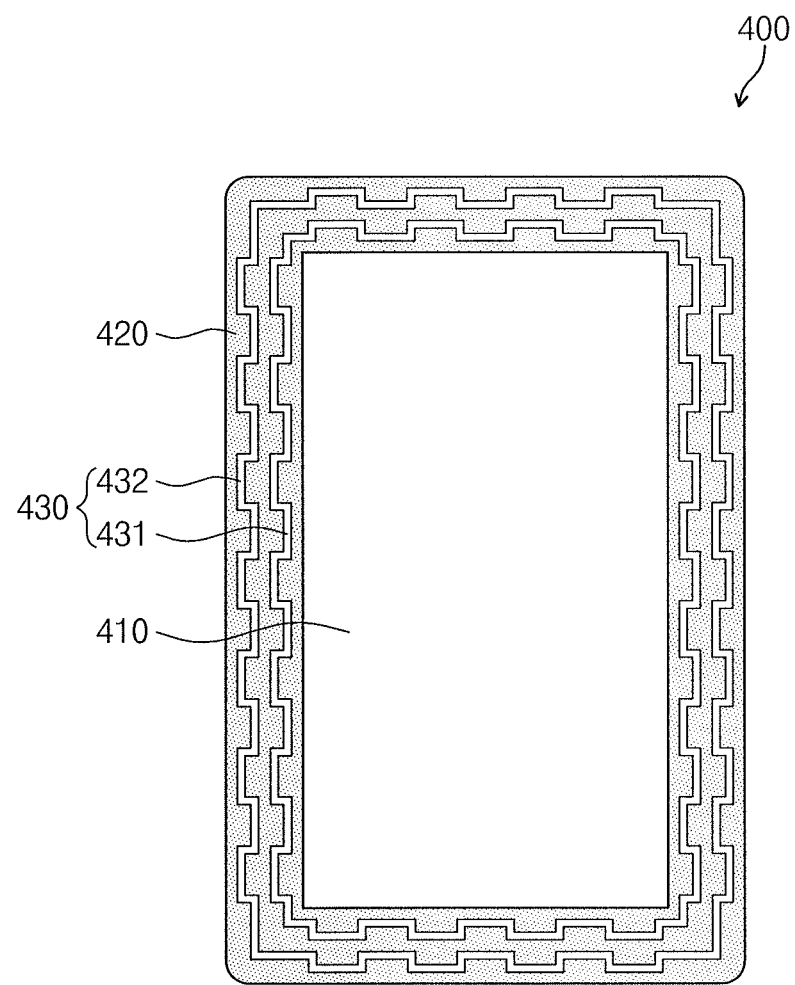

DISPLAY APPARATUS

CROSS-REFERENCE TO RELATED APPLICATION

This application claims priority to and the benefit of Korean Patent Application No. 10-2012-0012924, filed on Feb. 8, 2012, in the Korean Intellectual Property Office, the entire contents of which are hereby incorporated by reference.

BACKGROUND

With development in the information-oriented society, various display panels such as an organic light emitting display (OLED) panel, a liquid crystal display (LCD) panel, an electrophoretic display (EPD) panel, an electro-wetting display (EWD) panel, and the like may be applied to a display apparatus.

SUMMARY

Embodiments may be realized by providing a display apparatus that includes a display panel that displays an image, a window member that includes a base film that has a light transmission area penetrating the image, a blocking area that surrounds the light transmission area, a blocking pattern on the blocking area, and a dam pattern on the blocking pattern, and an adhesive layer between the display panel and the window member.

The dam pattern may include a first pattern that surrounds the light transmission area, and a second pattern that surrounds the first pattern. The first pattern and the second pattern may form a looped curve. The first pattern and the second pattern may be similar figures. The first pattern and the second pattern may have a zigzag shape. The dam pattern may include an open area in which the first and second patterns are partially removed.

A width of each of the first and second patterns may be greater than 0.3 mm. A thickness of each of the first and second patterns may be greater than 0.7 μm. A gap between the first pattern and the second pattern may be greater than 0.3 mm.

The blocking pattern may include a light blocking material. The display apparatus may include a polarization member between the adhesive layer and the display panel. The adhesive layer may include a transparent polymer resin.

Embodiments may also be realized by providing a display apparatus having an organic light emitting display panel that includes a base substrate and an organic light emitting device on the base substrate, a window member that includes a base film, a blocking area, a blocking pattern, and a dam pattern, the base film has a light transmission area penetrating an image generated from the organic light emitting display panel, the blocking area surrounds the light transmission area, the blocking pattern is on the blocking area, the dam pattern is on the blocking pattern, and an adhesive layer between the organic light emitting display panel and the window member. The organic light emitting device has a first electrode on the base substrate, an organic film on the first electrode, and a second electrode on the organic film.

BRIEF DESCRIPTION OF THE FIGURES

Features will become apparent to those of ordinary skill in the art by describing in detail exemplary embodiments with reference to the attached drawings in which:

FIGS. 8 and 9 are top views of window members according to exemplary embodiments.

DETAILED DESCRIPTION

Figure 1:
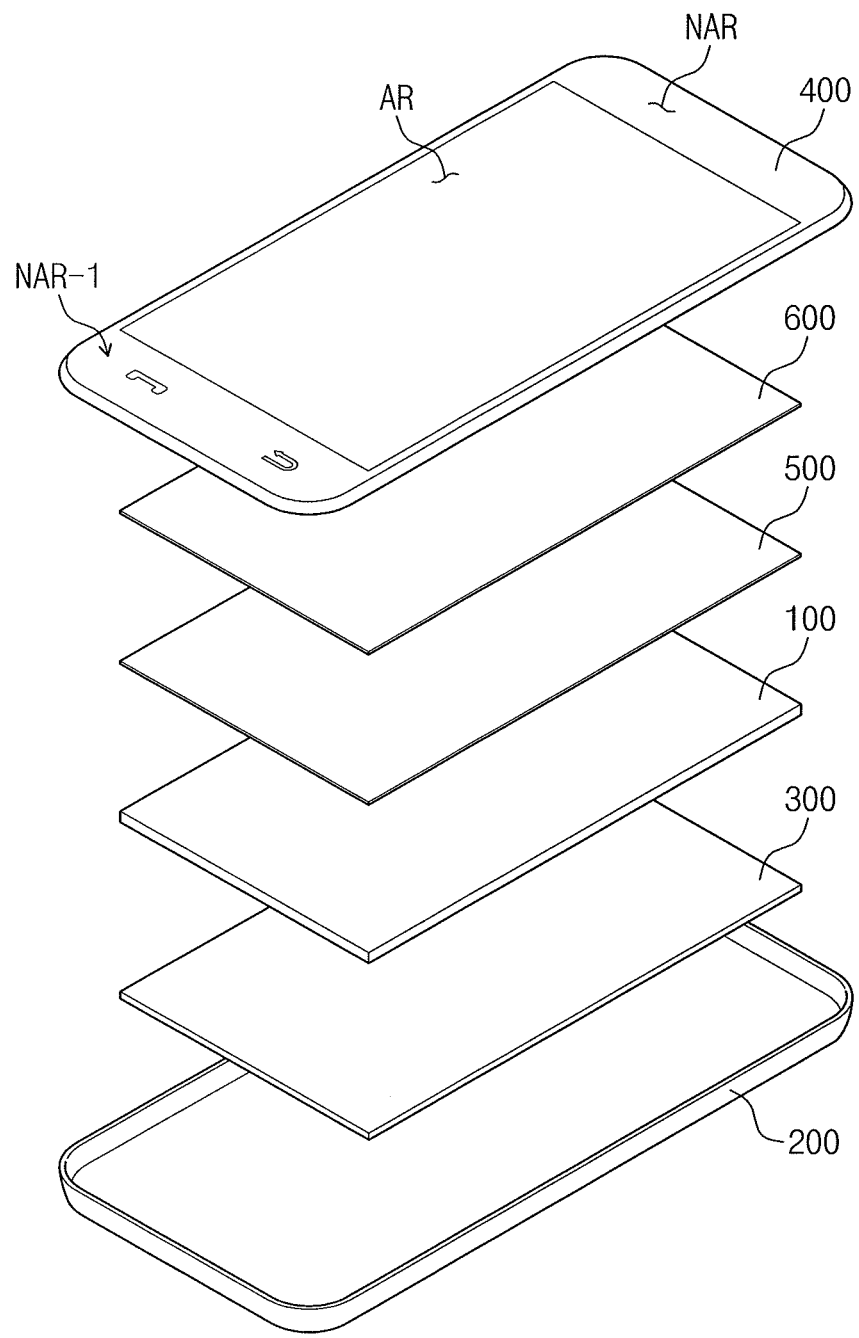
FIG. 1 is an exploded perspective view of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
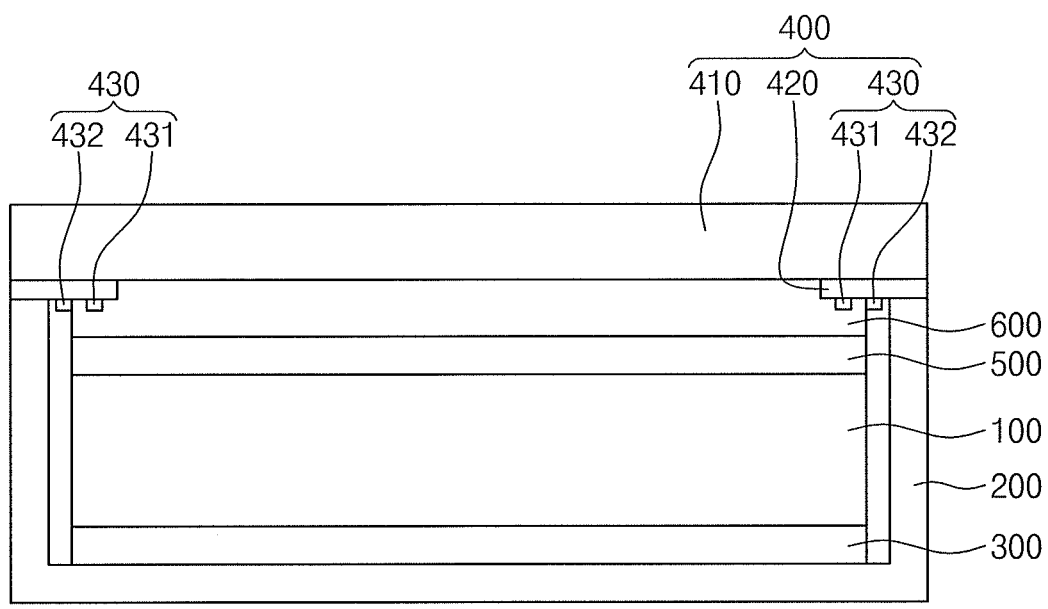
FIG. 2 is a cross-sectional view of the display apparatus in FIG. 1.

FIG. 1 is an explored perspective view of a display apparatus according to an exemplary embodiment. FIG. 2 is a cross-sectional view of a display apparatus in FIG. 1.

Referring to FIGS. 1 and 2, a mobile apparatus according to an exemplary embodiment may include a display panel 100, a housing 200 receiving the display panel 100, a window member 400 disposed over the display panel 100 (e.g., engaged with the housing 200), an impact absorption sheet 300 disposed between the display panel 100 and the housing 200, a polarization member 500 disposed between the display panel 100 and the window member 400, and an adhesive layer 600 disposed between the window member 400 and the polarization member 500.

The display panel 100 may be configured to display an image thereon. The display panel 100 is not limited to a specific panel, e.g., the display panel 100 may be formed of an emissive display device such as the OLED panel. According to another exemplary embodiment, the display panel 100 may be formed of a non-emissive display panel such as the EPD panel or the EWD panel. In case that the non-emissive display panel is used as the display panel 100, the display apparatus may include a back-light unit (not shown) supplying a light to the display panel 100. The back-light unit may be in an area or adjacent to an area between the impact absorption sheet 300 and the display panel 100.

The housing 200 may receive the display panel 100. In FIG. 1, there is illustrated the case that a housing is formed of a member having a space in which the display panel 100 is received. However, it is well understood that the housing 200 may be formed of two or more members. Exemplary embodiments in which the housing 200 is formed of one member is described below for ease of explanation.

In addition to the display panel 100, although not shown in FIG. 1, the housing 200 may further receive a printed circuit board on which a plurality of active elements and/or a plurality of passive elements are mounted. The housing 200 may receive a power supply (not shown) such as a battery according to a type of display apparatus.

The impact absorption sheet 300 may be disposed between the display panel 100 and the housing 200, and may absorb an external impact force that may be applied to the display panel 100. Thus, the impact absorption sheet 300 may reduce the possibility of and/or prevent an external impact from being applied directly to the display panel 100.

The impact absorption sheet 300 may include an impact absorption film (not shown) capable of absorbing an external impact and an adhesive material (not shown) coated on at least one of opposing surfaces of the impact absorption film. For example, the adhesive material may be coated on one surface of the impact absorption film such that the impact absorption sheet 300 is fixed at the display panel 100 or the housing 200. The impact absorption film may be formed of a rubber foam or a lamination of the rubber foam, and may have a thickness of about 300 μm.

The window member 400 may be disposed on a direction where an image is output from the display panel 100. The window member 400 may be united with the housing 200, e.g., in an interlocking arrangement, to form an outer surface of the display apparatus together with the housing 200. Accordingly, the impact absorption sheet 300, the display panel 100, the polarization member 500, and the adhesive layer 600, and any other optional components such as a back light unit (not shown) may be enclosed, e.g., completely enclosed, within the window member 400 and the housing 200.

On a plane, the window member 400 may include a display region AR for the displaying of an image generated from the display panel 100 and a non-display region NAR adjacent to at least a part of the display region AR. The non-display region NAR may surround, e.g., completely surround, the display region AR. The non-display region NAR may not be used to display an image, e.g., the non-display region NAR may not expose a display region of the display panel 100.

At least a part of the non-display region NAR may be defined as an input icon region NAR-I. The input icon region NAR-I may be activated when the display apparatus operates at a specific mode. For example, the input icon region NAR-I may include user input keys.

The polarization member 500 may reduce the possibility of and/or prevent the image display performance of the display panel 100 from being lowered due to reflection of a light incident from the exterior (hereinafter, referred to as an external light). For example, the polarization member 500 may include a polarization film (not shown) having a polarization axis in a specific direction and a retardation film (not shown) having a phase difference of, e.g., about ¼λ. The polarization member 500 may reduce the possibility of and/or prevent the image display performance of the display panel 100 from being lowered due to reflection of the external light by converting the external light into a circular polarization. The polarization member 500 may be excluded as occasion demands.

The adhesive layer 600 may unite the display panel 100 and the polarization member 500. The adhesive layer 600 may be transparent to reduce the possibility of and/or prevent the brightness of an image output from the display panel 100 from being reduced due to the adhesive layer 600. For example, the adhesive layer 600 may be formed of a transparent polymer resin that is adhesive and is hardened by light or heat.

Figure 3:
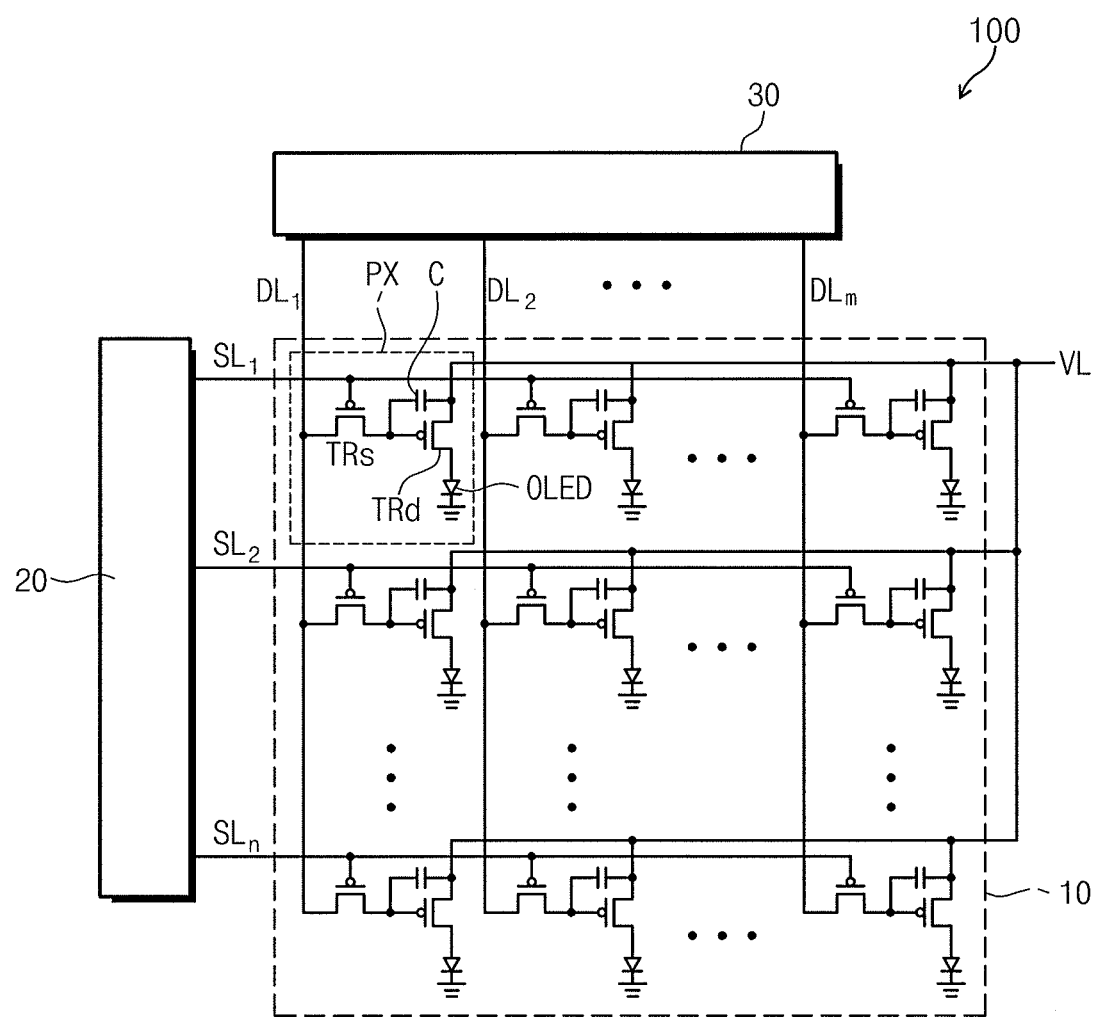
FIG. 3 is a circuit diagram schematically illustrating a display panel in FIG. 1.
Figure 4:
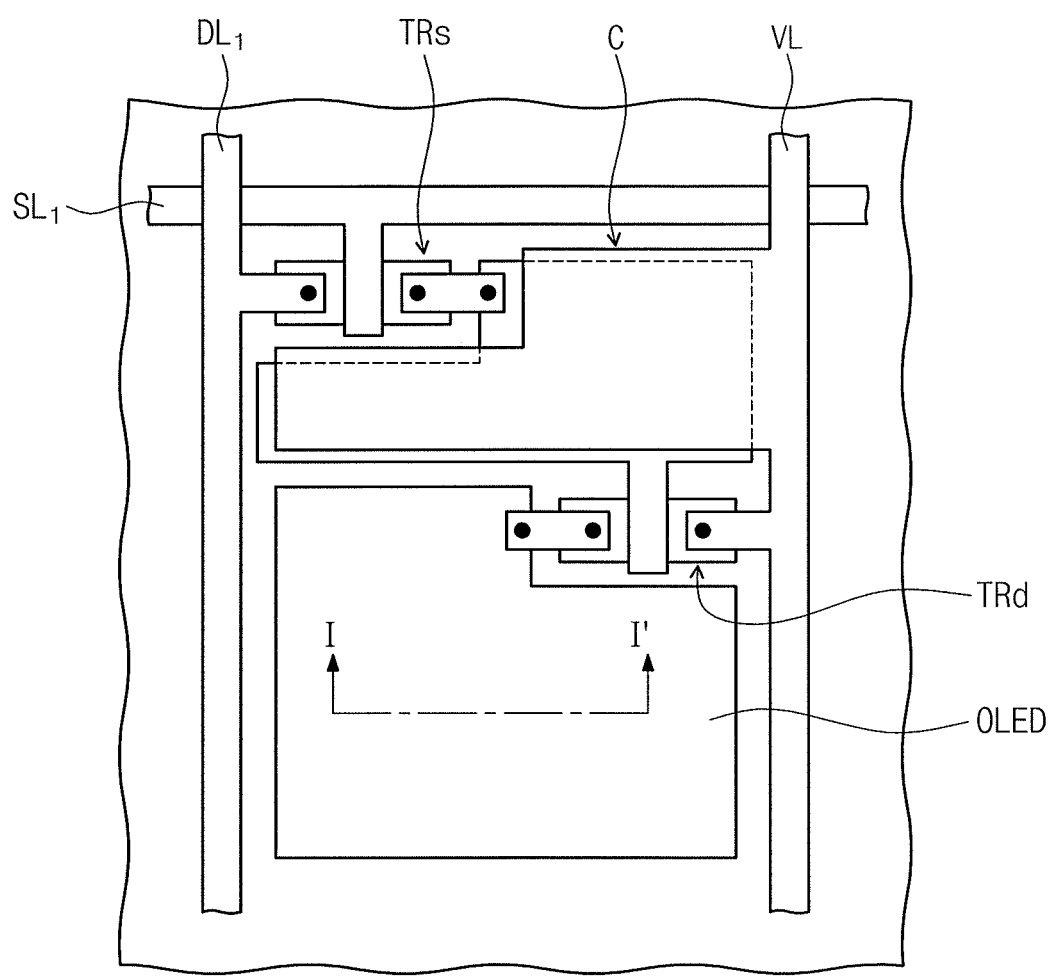
FIG. 4 is a top view of a pixel in FIG. 3.

FIG. 3 is a circuit diagram schematically illustrating a display panel in FIG. 1. FIG. 4 is a top view of a pixel in FIG. 3.

Referring to FIGS. 3 and 4, an organic light emitting display panel may be used as a display panel 100. However, embodiments are not limited thereto and the display panel and the pixels therein may be adapted for other types of display devices as is known in the art. The display panel 100 may include a display unit 10 displaying an image, a scan driver 20, and a data driver 30. The display unit 10 may include a plurality of pixels PX arranged therein.

The scan driver 20 may be electrically connected to the display unit 10 via a plurality of scan lines $SL_1$ to $SL_n$. The scan driver 20 may send scan signals to the display unit 10 via the scan lines $SL_1$ to $SL_n$. The scan lines $SL_1$ to $SL_n$ may extend in one direction to be connected to a plurality of the pixels PX along the one direction.

The data driver 30 may be electrically connected to the display unit 10 via a plurality of data lines $DL_1$ to $DL_m$. The data driver 30 may send data signals to the display unit 10 via the data lines $DL_1$ to $DL_m$. The data lines $DL_1$ to $DL_m$ may be intersected with the scan lines $SL_1$ to $SL_n$. The data lines $DL_1$ to $DL_m$ may be extendable.

The display panel 100 may further comprise a power line VL supplying a power to the display unit 10.

The display unit 10 may include the plurality of pixels PX, each of which is electrically connected to a corresponding data line, a corresponding scan line, and the power line VL. According to an exemplary embodiment, each pixel PX may include a switching transistor TRs, a driving transistor TRd, and an organic light emitting device/diode OLED.

In operation, scan signals may be transferred to the pixels PX via the scan lines $SL_1$ to $SL_m$ from the scan driver 20, and data signals may be transferred to the pixels PX via the data lines $DL_1$ to $DL_n$ from the data driver 30. In each pixel PX, the driving transistor TRd may be turned on by the data signal transferred via the switching transistor TRs that is controlled by the scan signal. That is, the driving transistor TRd may supply a driving current corresponding to the data signal to the organic light emitting device/diode OLED. At this time, the organic light emitting device/diode OLED may output a color corresponding to the driving current.

A capacitor C may be connected between a drain and a gate of the driving transistor TRd to retain the data signal during a given period of time. Although the switching transistor TRs is turned off, a data signal stored in the capacitor C may be applied to the gate of the driving transistor TRd.

Although not shown in figures, the organic light emitting display panel may further include a plurality of thin film transistors and a plurality of capacitors to compensate threshold voltages of the driving transistors.

Figure 5:
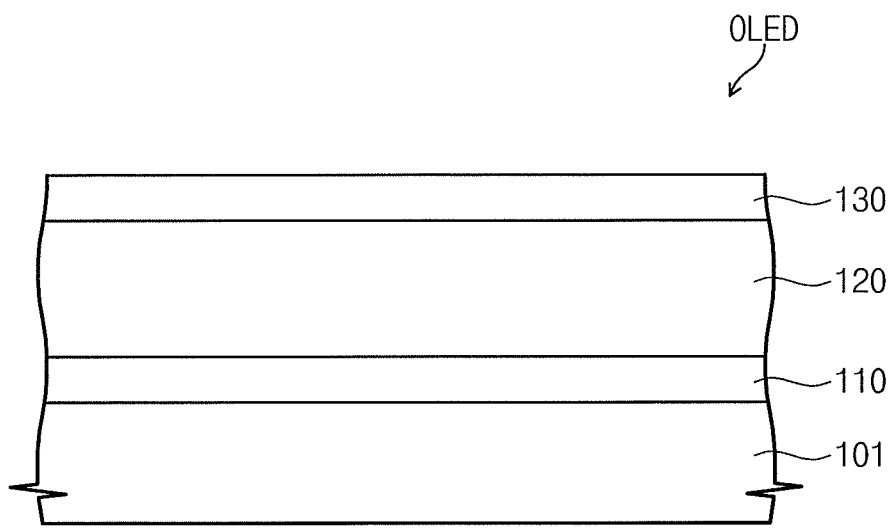
FIG. 5 is a cross-sectional view taken along a line I-I' in FIG. 4.

FIG. 5 is a cross-sectional view taken along a line I-I' in FIG. 4.

Referring to FIG. 5, an organic light emitting device/diode OLED may include a first electrode 110, an organic film 120, and a second electrode 130 that are sequentially stacked on a base substrate 101. One of the first electrode 110 and the second electrode 130 may be an anode electrode, and the other thereof may be a cathode electrode. In an exemplary embodiment, the first electrode 110 is an anode electrode and the second electrode 130 is a cathode electrode.

The first electrode 110 may be a conductive film including a transparent conductive oxide such as ITO (Indium Tin Oxide), IZO (Indium Zinc Oxide), AZO (Aluminum Zinc Oxide), GZO (gallium doped zinc oxide), ZTO (zinc tin oxide), GTO (Gallium tin oxide), or FTO (fluorine doped tin oxide). The first electrode 110 may be electrically connected to a driving transistor TRd illustrated in FIG. 4, and may be supplied with a driving current corresponding to a data signal.

The organic film 120 may include at least an emissive layer EML. The organic film 120 may have a multi-layer thin film structure such as to form a stacked structure. For example, the organic film 120 may include various combinations of, e.g., a hole injection layer HIL (e.g., injecting holes), an emissive layer EML (e.g., emitting a light via recombination of injected holes and electrons), a hole transport layer HTL (e.g., having an excellent hole transfer characteristic and increasing recombination between holes and electrons by suppressing a transport of electrons, which are not combined at the emissive layer EML), a hole block layer HBL (e.g., suppressing a transfer of holes not combined at the emissive layer EML), an electron transport layer ETL (e.g., smoothly transferring electrons at the emissive layer EML), and an electron injection layer EIL (e.g., injecting electrons).

The organic film 120 may be formed of a low molecular weight and/or polymer organic material. The organic film 120 may be formed of a low molecular weight material such as copper phthalocyanine (CuPc), N,N'-Di(naphthalene-1-yl)-N,N'-diphenyl-benzidine (NPB), or tris-8-hydroxyquinoline aluminum (Alq3). In other exemplary embodiments, the organic film 120 may be formed of a polymer organic material such as poly-(2,4)-ethylene-dihydroxy thiophene (PEDOT) or polyaniline (PANI).

In case that a polymer organic material is used as an emissive layer of the organic film 120, the emissive layer may be formed of one of PPV, Soluble PPV's, CyanoPPV, or Polyfluorene. The emissive layer may be a stack type or a tandem type. A stack-type emissive layer may be formed of, e.g., red, green, and blue sub-emissive layers. A stacking order of the red, green, and blue sub-emissive layers may not be specially limited. In case of the stack-type and tandem-type emissive layers, the red, green, and blue sub-emissive layers all may be a fluorescent emissive layer, or at least one or more thereof may be a phosphorescent emissive layer. In the tandem-type emissive layer, emissive layers stacked on both sides of a charge generation layer CGL may emit a white color, different colors, or the same color. In this case, the different colors or the same color may be a single color or multicolored.

The second electrode 130 may reflect a light, and may include at least one selected from Mo, MoW, Cr, Al, AlNd, and an Al alloy, which may have a lower work function compared with the first electrode 110.

Figure 6:
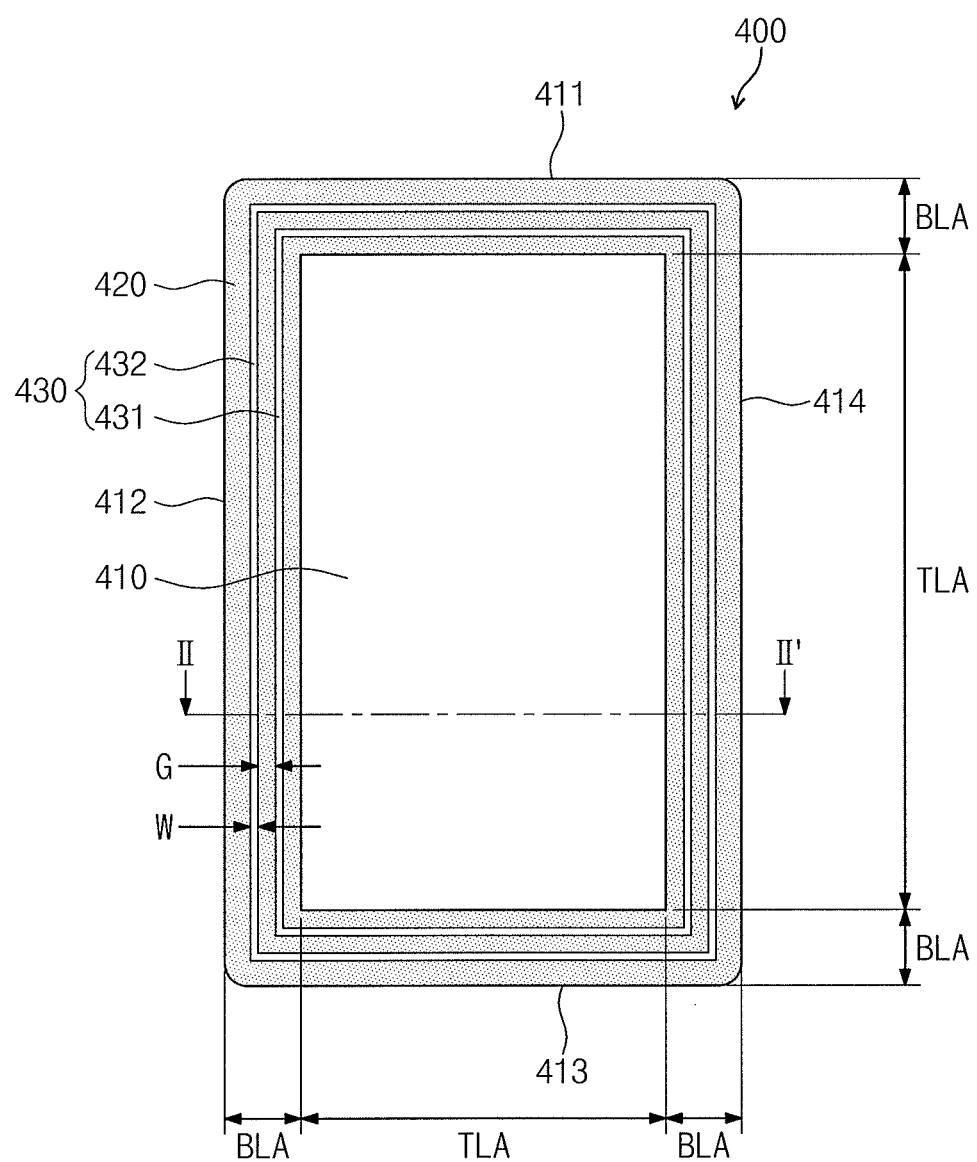
FIG. 6 is a top view of a window member illustrated in FIG. 1.
Figure 7:
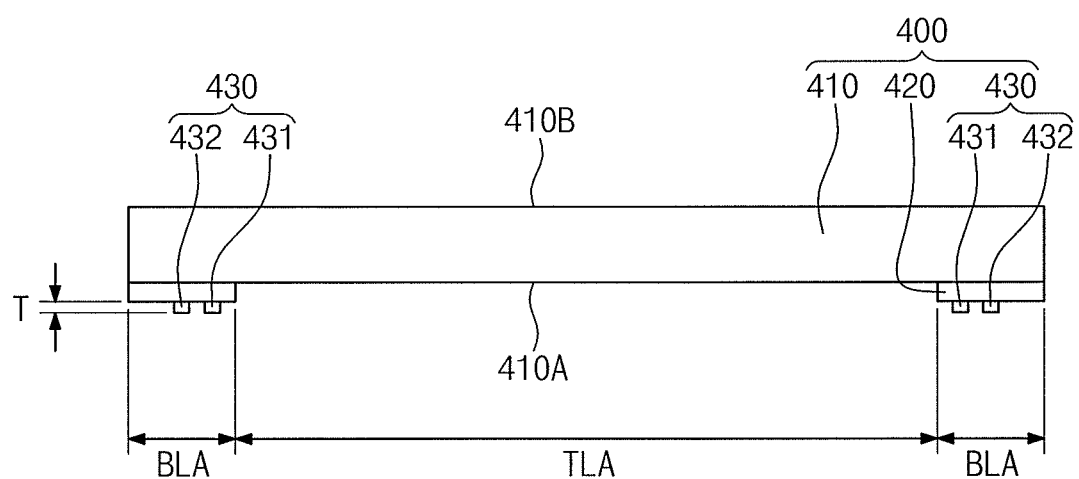
FIG. 7 is a cross-sectional view taken along a line II-II' of FIG. 6.

Below, a window member in FIGS. 1 and 2 will be more fully described with reference to FIGS. 6 and 7. In FIGS. 6 and 7, elements that are identical to those in FIGS. 1 and 2 may be marked by the same reference numerals.

FIG. 6 is a top view of a window member illustrated in FIG. 1. FIG. 7 is a cross-sectional view taken along a line II-II' of FIG. 6.

Referring to FIGS. 6 and 7, the window member 400 may include a base film 410, a blocking pattern 420, and a dam pattern 430. The base film 410 may form an outermost surface of the display apparatus. The blocking pattern 420 may be adjacent to, e.g., only at, peripheral edges of the window member 400 and the dam pattern 430 may be formed on, e.g., only on, portions of the blocking pattern 420. The blocking pattern 420 may be between the dam pattern 430 and the base film 410.

The base film 410 may have a tetragonal shape that includes a first edge 411, a second edge 412 intersecting the first edge 411, and a third edge 413 and a fourth edge 414 parallel with the first edge 411 and the second edge 412, respectively. The first and third edges 411 and 413 may be a short edge of the base film 410, and the second and fourth edges 412 and 414 may be a long edge of the base film 410.

The base film 410 may include a first surface 410A of a display panel direction and a second surface 410B exposed to the outside. The base film 410 may be, e.g., a high-intensity transparent plastic substrate or a high-intensity transparent glass substrate. The base film 410 may include a light transmission area TLA penetrating a light and a blocking area BLA surrounding the light transmission area TLA. That is, the light transmission area TLA may be an area through which an image generated from the display panel 100 passes.

The blocking pattern 420 may be disposed on the first surface 410A of the base film 410 in the blocking area BLA, e.g., the blocking pattern 420 may define the blocking area BLA so as to completely within the blocking area BLA. The blocking pattern 420 may include a material that is capable of blocking a light. For example, the blocking pattern 420 may include a metallic material, having a low reflection ratio, such as one of Cr and Mo. According to another exemplary embodiment, the blocking pattern 420 may include an opaque inorganic insulation material such as one of a CrOx and/or a MoOx. According to yet another exemplary embodiment, the blocking pattern 420 may include an opaque organic insulation material such as a black resin.

The dam pattern 430 may be disposed on the blocking pattern 420, e.g., may be arranged only on portions of the blocking pattern 420 in the blocking area BLA. The dam pattern 430 may reduce the possibility of and/or prevent a transparent polymer resin, e.g., a transparent polymer resin used to form the adhesive layer 600, from being leaked to the outside. For example, the dam pattern 430 may be a barrier reducing and/or preventing a fluctuation of the transparent polymer resin. The dam pattern 430 may have a different shape and/or configuration than the blocking pattern 420. According to an exemplary embodiment, the dam pattern 430 may include the same material as the blocking pattern 420. According to another exemplary embodiment, the dam pattern 430 may include a different material such as a material capable of penetrating a light.

The dam pattern 430 may include a first pattern 431 surrounding, e.g., completely surrounding, the light transmission area TLA and a second pattern 432 surrounding, e.g., completely surrounding, the first pattern 431. Each of the first and second patterns 431 and 432 may be formed to have a shape of a looped curve, e.g., a closed rectangular shape, that includes a line parallel with each of the first to fourth edges 411 to 414. Further, the first pattern 431 and the second pattern 432 may be similar figures, e.g., may have the same shape and/or configuration In example embodiments, a width of each of the first and second patterns 431 and 432 may be over, e.g., greater than, about 0.3 mm. The width may be measured in a direction between the first and second patterns 431 and 432. A thickness T of each of the first and second patterns 431 and 432 may be over, e.g., greater than, about 0.7 μm. If a width of each of the first and second patterns 431 and 432 is over about 0.3 mm and a thickness of each of the first and second patterns 431 and 432 is over about 0.7 μm, it may be possible to prevent fluctuation of the transparent polymer resin.

A gap G between the first pattern 431 and the second pattern 432 may be over about 0.3 mm so that the first pattern 431 is spaced apart from the second pattern 432. The transparent polymer resin overflowing the first pattern 431 may be contained in the gap between the first pattern 431 and the second pattern 432. Accordingly, it is possible to reduce the possibility of and/or prevent the transparent polymer resin from flowing outside the second pattern 432.

Below, a display apparatus fabricating method according to an exemplary embodiment will be more fully described.

Referring to FIG. 1, the impact absorption sheet 300, the display panel 100, and the polarization member 500 may be sequentially received within the housing 200.

The adhesive layer 600 may be formed by coating a transparent polymer resin on an exposed surface of the polarization member 500.

After forming the adhesive layer 600, the window member 400 may be disposed on the adhesive layer 600. Herein, a dam pattern 430 of the window member 400 may be a barrier reducing the possibility of and/or preventing fluctuation of the transparent polymer resin of the adhesive layer 600. That is, the dam pattern 430 may prevent the transparent polymer resin from being overflowed outside the display panel 100.

After disposing the window member 400 on the adhesive layer 600, the adhesive layer 600 may be hardened by light and/or heating. Thus, the window member 400 may be fixed at the polarization member 500 by the adhesive layer 600. In case that the polarization member 500 is skipped, the window member 400 may be directly fixed to the display panel 100 by the adhesive layer 600.

Figure 8:
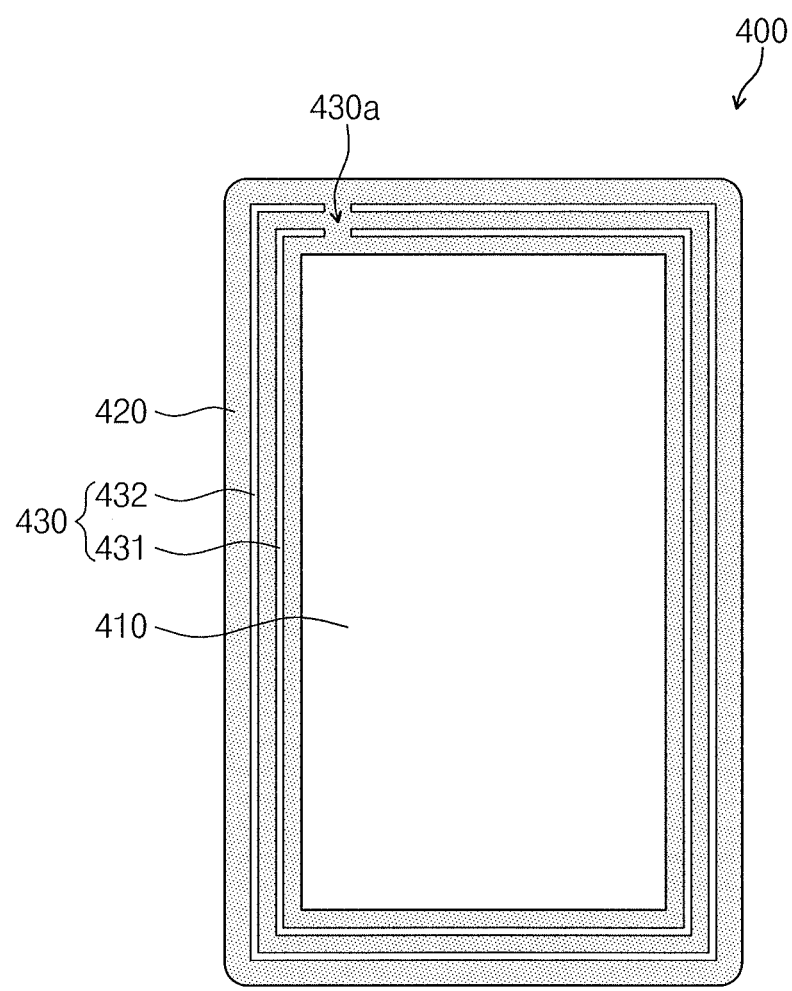

Below, another exemplary embodiment will be described with reference to FIG. 8. In FIG. 8, elements that are substantially the same as those in FIGS. 1 to 7 may be marked by the same reference numerals, and repeated description thereof is thus omitted.

FIG. 8 is a top view of a window member according to another exemplary embodiment.

Referring to FIG. 8, a window member 400 may be applicable to a display apparatus, and may include a base film 410 having a light transmission area TLA and a blocking area BLA, a blocking pattern 420 disposed on the blocking area BLA, and a dam pattern 430 disposed on the blocking pattern 420.

The dam pattern 430 may include a first pattern 431 surrounding the light transmission area TLA and a second pattern 432 surrounding the first pattern 431.

The dam pattern 430 may include an open area 430A at which the first and second patterns 431 and 432 are partially removed, e.g., are excluded in a specific region. In case that a transparent polymer resin of the adhesive layer 600 is excessively coated, the open area 430A may be used to discharge a part of the transparent polymer resin before hardening the adhesive layer 600.

With the display apparatus according to exemplary embodiments, it may be possible to discharge a part of the excessively coated transparent polymer resin via the open area 430A of the dam pattern 430. Further, it may be easy to remove the discharged transparent polymer resin by discharging the transparent polymer resin to a specific area.

Below, still another exemplary embodiment will be described with reference to FIG. 9. In FIG. 9, elements that are substantially the same as those in FIGS. 1 to 7 may be marked by the same reference numerals, and repeated description thereof is thus omitted.

FIG. 9 is a top view of a window member according to still another exemplary embodiment.

Referring to FIG. 9, a window member 400 may be applicable to a display apparatus, and may include a base film 410 having a light transmission area TLA and a blocking area BLA, a blocking pattern 420 disposed on the blocking area BLA, and a dam pattern 430 disposed on the blocking pattern 420.

The dam pattern 430 may include a first pattern 431 surrounding the light transmission area TLA and a second pattern 432 surrounding the first pattern 431. Herein, the first pattern 431 and the second pattern 432 may form a looped curve having a zigzag shape (or, an embossed shape). The first and second patterns 431 and 432 may have complementary shapes that include a plurality of portions substantially parallel to the first to fourth edges 411 to 414 and a plurality of other portions substantially perpendicular to the first to fourth edges 411 to 414. According to another exemplary embodiment, the zigzag shape may include an open area as illustrated in FIG. 8.

Thus, an effect of a barrier reducing the possibility of and/or preventing fluctuation of the transparent polymer resin may achieved by forming the first pattern 431 and the second pattern 432, e.g., as illustrated in FIGS. 6, 8, and 9.

By way of summation and review, a display apparatus may include a display panel, a case receiving the display panel, and a window protecting an exposed surface of the display panel. The display panel and the window may be joined using a transparent polymer resin to form an adhesive layer. However, if the transparent polymer resin is insufficiently hardened or excessively coated, overflow of the transparent polymer resin may arise. In contrast, embodiments relate to forming a pattern to reduce the possibility of and/or prevent fluctuation of the transparent polymer resin.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A display apparatus, comprising:
    a display panel that displays an image;
    a window member, the window member including:
        a base film that has a light transmission area that exposes the image of the display panel, the light transmission area being surrounding by a blocking area,
        a blocking pattern on the blocking area, and
        a dam pattern on the blocking pattern; and
    an adhesive layer between the display panel and the window member,
    wherein the dam pattern includes a plurality of patterns that surrounds the light transmission area, and the adhesive layer overflowing a pattern adjacent to the light transmission area of the patterns is contained between the patterns.

2. The display apparatus of claim 1, wherein the dam pattern includes:
    a first pattern in the blocking area that surrounds the light transmission area, and
    a second pattern in the blocking area that surrounds the first pattern.

3. The display apparatus of claim 2, wherein the first pattern and the second pattern form a looped curve.

4. The display apparatus of claim 3, wherein the first pattern and the second pattern have a zigzag shape.

5. The display apparatus of claim 2, wherein the first pattern and the second pattern are similar figures.

6. The display apparatus of claim 2, wherein the dam pattern includes an open area in which the first and second patterns are partially removed.

7. The display apparatus of claim 1, wherein the blocking pattern includes a light blocking material.

8. The display apparatus of claim 1, further comprising a polarization member between the adhesive layer and the display panel.

9. The display apparatus of claim 1, wherein the adhesive layer includes a transparent polymer resin.

10. The display apparatus of claim 1, wherein the dam pattern prevents the adhesive layer from being leaked to the outside.

11. The display apparatus of claim 1, wherein the dam pattern includes a transparent material.

12. A display apparatus, comprising:
    an organic light emitting display panel that includes a base substrate and an organic light emitting device on the base substrate;
    a window member, the window member including:
        a base film that has a light transmission area that exposes the image of the display panel, the light transmission area being surrounding by a blocking area,
        a blocking pattern on the blocking area, and
        a dam pattern on the blocking pattern; and
    an adhesive layer between the organic light emitting display panel and the window member,
    wherein the organic light emitting device has a first electrode on the base substrate, an organic film on the first electrode, and a second electrode on the organic film;
    wherein the dam pattern includes a plurality of patterns that surrounds the light transmission area, and the adhesive layer overflowing a pattern adjacent to the light transmission area of the patterns is contained between the patterns.

13. The display apparatus of claim 12, wherein the dam pattern includes:
    a first pattern in the blocking area that surrounds the light transmission area, and
    a second pattern in the blocking area that surrounds the first pattern.

14. The display apparatus of claim 13, wherein the first pattern and the second pattern form a looped curve.

15. The display apparatus of claim 14, wherein the first pattern and the second pattern have a zigzag shape.

16. The display apparatus of claim 13, wherein the dam pattern includes an open area in which the first and second patterns are partially removed.

17. The display apparatus of claim 13, wherein the dam pattern includes a gap between the first pattern and the second pattern so that the first pattern is spaced apart from the second pattern.

18. The display apparatus of claim 17, wherein the adhesive layer overflowing the first pattern is contained in the gap.

19. The display apparatus of claim 12, wherein the dam pattern has a different shape and/or configuration than the blocking pattern.

20. The display apparatus of claim 12, wherein the dam pattern includes a different material than the blocking pattern.

* * * * *